United States Patent
Nakajima

[19]

[11] Patent Number: 5,889,427
[45] Date of Patent: Mar. 30, 1999

[54] VOLTAGE STEP-UP CIRCUIT

[75] Inventor: Yasuhiro Nakajima, Tokyo, Japan

[73] Assignee: NEC Corporation, Tokyo, Japan

[21] Appl. No.: 634,940

[22] Filed: Apr. 19, 1996

[30] Foreign Application Priority Data

Apr. 20, 1995 [JP] Japan ................................ 7-095303

[51] Int. Cl.[6] .............................. H03K 3/01; H02M 3/18
[52] U.S. Cl. ......................... 327/536; 327/313; 327/540
[58] Field of Search ........................... 327/333, 534–537,
327/314, 320, 325, 538, 540, 541, 543,
544, 313, 327, 328, 178, 180

[56] References Cited

U.S. PATENT DOCUMENTS

| | | | |
|---|---|---|---|
| 4,454,571 | 6/1984 | Miyashita | 327/534 |
| 4,970,409 | 11/1990 | Wada et al. | 327/541 |
| 5,072,134 | 12/1991 | Min | 327/536 |
| 5,093,586 | 3/1992 | Asari | 327/530 |
| 5,180,928 | 1/1993 | Choi | 327/536 |
| 5,489,870 | 2/1996 | Arakawa | 327/534 |
| 5,513,091 | 4/1996 | Uchida et al. | 327/536 |
| 5,675,279 | 10/1997 | Fujimoto et al. | 327/536 |

*Primary Examiner*—Timothy P. Callahan
*Assistant Examiner*—Eunja Shin
*Attorney, Agent, or Firm*—Foley & Lardner

[57] ABSTRACT

A parallel connection of an enhancement type nMOS transistor and an enhancement type pMOS transistor is connected between an input terminal receiving a clock signal and a capacitor. The pMOS transistor is turned on and off in dependece on an output of a power supply voltage detector, so that a signal transmission path between the input terminal and the capacitor, as the clock signal is at a high level, has a switched position at a side of the nMOS transistor when the power supply voltage is high, and a switched postiion at a side of the pMOS transistor when the power supply voltage is low. Due to a threshold drop effect of the nMOS transistor, a signal amplitude of a high level is limited to an output level of a limiter minus a threshold voltage of the nMOS transistor, reducing a charge-discharge current of the capacitor.

4 Claims, 6 Drawing Sheets

VOLTAGE STEP-UP CIRCUIT

BACKGROUND OF THE INVENTION

The present invention relates generally to a voltage step-up circuit, and particularly, to a voltage step-up circuit of a type including a pair of diode-connected MOS field effect transistors serially connected between a power supply terminal and an output terminal of the circuit in a forward direction for conduction from the power supply terminal to the output terminal and a capacitor connected to a serial interconnection between the transistors, so that a charge pump action depending on an externally input periodical signal permits a higher voltage than a power supply voltage to be output.

DESCRIPTION OF THE RELATED ART

Figure 1A:
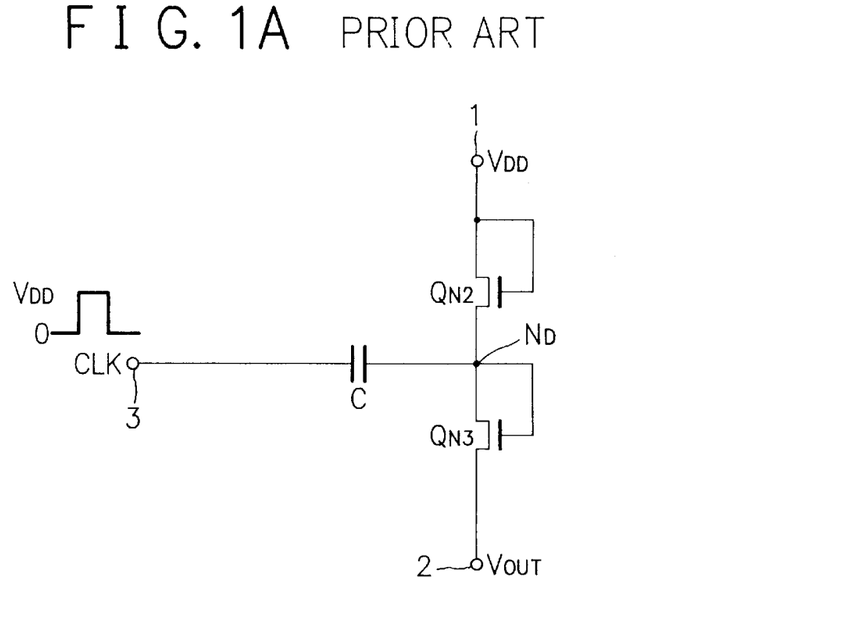
FIG. 1A is a circuit diagram of a conventional voltage step-up circuit.

FIG. 1A shows a conventional voltage step-up circuit of such the type.

The conventional voltage step-up circuit has a pair of n-channel MOS field effect transistors (hereafter each respectively "nMOS transistor") $Q_{N2}$ and $Q_{N3}$ serially connected between a power supply terminal 1 and an output terminal 2.

A serial interconnection at a node $N_D$ between the nMOS transistors $Q_{N2}$ and $Q_{N3}$ is connected to an electrode of a capacitor C of which another electrode is connected to an input terminal 3.

The nMOS transistors $Q_{N2}$ and $Q_{N3}$ each have a so-called diode-connection in which a drain electrode and a gate electrode are common-connected to each other. The nMOS transistor $Q_{N2}$ has its drain (gate) electrode connected to the power supply terminal 1, and its source electrode connected to one electrode of the capacitor C, at the node $N_D$ side. The nMOS transistor $Q_{N3}$ has its drain (gate) electrode connected to the node $N_D$, and its source electrode connected to the output terminal 2.

In other words, the nMOS transistors $Q_{N2}$ and $Q_{N3}$ serves as a p-n junction diode serially connected in a forward direction for conduction between from the power supply terminal 1 to the output terminal 2.

In the conventional circuit of FIG. 1A, the power supply terminal provides a direct current power supply voltage $V_{DD}$, the input terminal 3 receives a clock signal CLK with an amplitude varying between a 0V level and a $V_{DD}$ level, and the output terminal 2 outputs an output voltage $V_{OUT}$ as a stepped up voltage of the power supply voltage $V_{DD}$.

There will be described below actions of the conventional circuit of FIG. 1B.

Figure 1B:
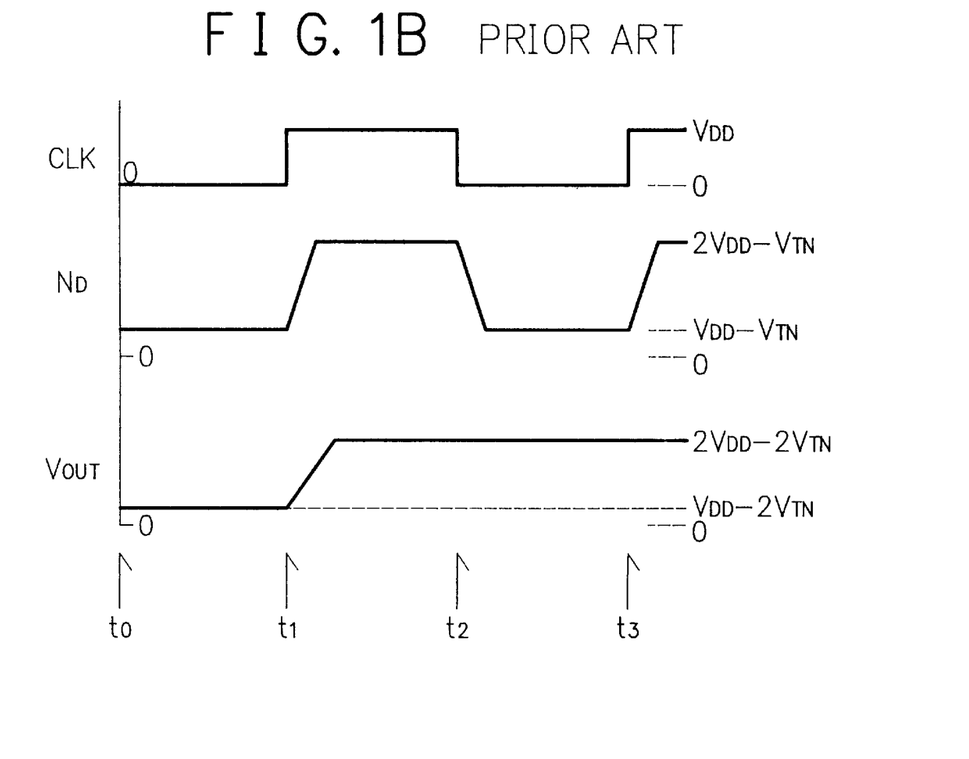
FIG. 1B is a time chart of signals associated with the voltage step-up circuit of FIG. 1A.

FIG. 1B is a time chart of signals associated with the voltage step-up circuit of FIG. 1A.

In the time chart of FIG. 1B, the clock signal CLK has a 0V level between from a time point to $t_0$ a time point $t_1$. a $V_{DD}$ level between from the time point $t_1$ to a time point $t_2$, and the 0V level between from the time point $t_2$ to a time point $t_3$.

(1) In the time interval $t_0$ to $t_1$:

The clock signal has the 0V level. The node $N_D$ has an equivalent voltage $(V_{DD}-V_{TN})$ to the power supply voltage $V_{DD}$ minus a threshold voltage $V_{TN}$ of the nMOS transistor $Q_{N2}$. Therefore, the capacitor C has stored therein a quantity Q of charges, such that:

$$\begin{aligned} Q &= \text{(voltage at node } N_D - \text{voltage at terminal 3)} \times \\ &\quad \text{(capacitance of capacitor } C\text{)} \\ &= \{(V_{DD} - V_{TN}) - 0\} \times C. \end{aligned}$$

The voltage $V_{OUT}$ of the output terminal 2 is equivalent to the voltage $V_{DD}$ at the node $N_D$ minus a threshold voltage $V_{TN}$ of the nMOS transistor $Q_{N3}$, i.e. $(V_{DD}-V_{TN})-V_{TN}=V_{DD}-2V_{TN}$.

(2) In the time interval $t_1$ to $t_2$:

The clock signal CLK is changed from the 0V level to the $V_{DD}$ level. The capacitor tends to hold the quantity Q of charges stored in the time interval $t_0$ to $t_1$, so that:

$$\begin{aligned} Q &= \text{(voltage at node } N_D - \text{voltage at terminal 3)} \times \\ &\quad \text{(capacitance of capacitor } C\text{)} \\ &= [\{V_{DD} + (V_{DD} - V_{TN})\} - V_{DD}] \times C. \end{aligned}$$

Therefore, the node $N_D$ has a voltage of $V_{DD}+(V_{DD}-V_{TN})=2V_{DD}-V_{TN}$.

The output terminal 2 has a voltage $V_{OUT}$ equivalent to the voltage at the node $N_D$ minus the threshold voltage $V_{TN}$ of the nMOS transistor $Q_{N3}$, i.e. $(2V_{DD}-V_{TN})-V_{TN}=2V_{DD}-2V_{TN}$.

Accordingly, the output voltage $V_{OUT}$ is higher than the power supply voltage $V_{DD}$, while the nMOS transistor $Q_{N2}$ is turned off with the voltage at the source electrode (i.e. node $N_D$) higher than that at the gate electrode (i.e. power supply terminal 1).

(3) In the time interval $t_2$ to $t_3$:

The clock signal CLK is changed from the $V_{DD}$ level agagin to the 0V level. The capacitor C still tends to hold the charge quantity Q stored therein, so that:

$$\begin{aligned} Q &= \text{(voltage at node } N_D - \text{voltage at terminal 3)} \times \\ &\quad \text{(capacitance of capacitor } C\text{)} \\ &= \{(V_{DD} - V_{TN}) - 0\} \times C. \end{aligned}$$

Therefore, the node $N_D$ has a voltage equivalent to $V_{DD}-V_{TN}$.

At the nMOS transistor $Q_{N2}$ a voltage difference of $V_{TN}$ is developed between the gate electrode (i.e. power supply terminal 1) and the source electrode (i.e. node ND). The transistor $Q_{N2}$ is thus turned on.

However, as a tendency for the node $N_D$ to have an increased voltage is accompanied by a decreased voltage difference between the gate and source electrodes of the nMOS transistor $Q_{N2}$ this transistor $Q_{N2}$ is turned off so that the voltage at the node $N_D$ is set to $V_{DD}-V_{TN}$.

On the other hand, at the nMOS transistor $Q_{N3}$, the voltage at the source electrode (i.e. output terminal 2) is higher than that at the gate electrode (i.e. node $N_D$). The transistor $Q_{N3}$ is thus turned off.

Accordingly, the voltage $V_{OUT}$ is left, as it is obtained in the time interval $t_1$ to $t_2$, such that $V_{OUT}=2V_{DD}-2V_{TN}$. Therefore, there is kept output a higher voltage than the power supply voltage $V_{DD}$.

As will be seen from the foregoing description, the current consumption in the voltage step-up circuit substantially depends on a magnitude of a charge-discharge current i of the capacitor C, such that:

$$i = \text{(frequency } f \text{ of clock signal } CLK) \times$$
$$\text{(amplitude } v \text{ of the signal } CLK) \times$$
$$\text{(capacitance } C \text{ of capacitor } C),$$

which means that the charge-discharge current i of the capacitor C is proportional to both the amplitude v of the clock signal CLK and the capacitance C of the capacitor.

In the conventional circuit of FIG. 1A, the clock signal CLK applied to the capacitor C varies with a full swing between the 0V level and the $V_{DD}$ level, i.e. $V=V_{DD}$. Therefore, $i=f\sim V_{DD}\sim C$.

In a typical application to a semiconductor LSI, such the type of voltage step-up circuit is built on a single chip having incorporated other circuits, such as signal processing circuits and input/output circuits.

The power supply voltage $V_{DD}$ corresponds to a power supply voltage to the LSI that is variable within a range of e. g. 3.0V to 6.0V in accordance with an associated technical specification, and selectable in the range by the user, but unable to be desiganted by the manufacturer, who thus tends to employ a capacitor of an adquate capacitance to permit a sufficient step-up ratio to be achieved even in a case of a low power supply voltage.

If the power supply voltage for the LSI is as low as e.g. 3.0V, then the clock signal CLK has a small amplitude v, permitting the capacitor C to have a charge-discharge current small enough for the voltage step-up circuit to achieve a relatively small total current consumption, as well as a corresponding appropriate step-up ratio.

However, if the power supply voltage for the LSI is as high as e.g. 6.0V, then the capacitor C has a large charge-discharge current in proportion to the power supply voltage, resulting in a corresponding large current consumption. Moreover, an excessive stepped up voltage needs to be again stepped down to an adequate voltage, with the more increased current consumption.

The present invention has been achieved with such points in mind.

SUMMARY OF THE INVENTION

It therefore is an object of the present invention to provide a voltage step-up circuit with an identical voltage step-up ratio and an identical current consumption to a conventional circuit, when a power supply voltage is relatively low, and with a relatively small current consumption, when the power supply voltage is relatively high, thus permitting an improved power consumption characteristic.

To achieve the object, a genus of the present invention provides a voltage step-up circuit comprising an input terminal for receiving an externally supplied periodical signal with a high level, a power supply terminal for providing a power supply voltage, an output terminal, a pair of rectifying members serially connected between the power supply terminal and the output terminal, for a current conduction in a forward direction thereof from the power supply terminal to the output terminal, and a capacitor having a pair of electrode members of which one electrode member is connected to a serial interconnection between the rectifying members, in which the periodical signal supplied to the input terminal is input to the other electrode member of the capacitor to have a voltage at the serial interconnection periodically vary so that the output terminal has developed thereon a higher voltage than the power supply voltage, wherein the voltage step-up circuit further comprises a signal transmission path for transmitting the periodical signal to be input from the input terminal to the capacitor, and an amplitude limiting means engaged with the signal transmission path for performing an analog switch action in response to the periodical signal and amplitude-limitting the periodical signal, as it has the high level, at a high-level side thereof in accordance with the analog switch action.

According to the genus of the invention, therefore, there can be achived an identical voltage step-up ratio and an identical current consumption to a conventional circuit, when a power supply voltage is relatively low, and a relatively small current consumption, when the power supply voltage is relatively high, so that an improved power consumption characteristic is available.

According to a species of the genus of the invention, the amplitude limiting means comprises a level conversion member privided in the signal transmission path for stepping down an amplitude of the periodical signal, at the high-level side thereof, to provide a level-converted signal to the capacitor, and a switch member connected in parallel to the level converion member for making a bypass thereto, as the switch member is conductive.

According to an individual of the species of the invention, the level conversion member comprises an n-channel MOS field effect transistor of an enhancement type having a threshold drop effect, and the switch member comprises a p-channel MOS field effect transistor of an enhancement type.

According to the individual of the invention, it is facilitated to incorporate an improved voltage step-up circuit in a single chip of a semiconductor LSI, permitting an application to a wide-employed recent LSI to achieve a significant effect to a low power consumption characteristic thereof.

The voltage step-up circuit may preferably further comprise means for generating from the power supply voltage a constant voltage not exceeding the power supply voltage and providing the constant voltage as a gate voltage of the n-channel MOS field effect transistor so that the level-converted signal has a controlled voltage on the high-level side thereof, and means for making the p-channel MOS field effect transistor conductive and non-conductive in accordance with a level of the power supply voltage so that the signal transmission path, as the periodical signal has the high level, is responsive to the level of the power supply voltage to have a switched position at a side of the n-channel MOS field effect transistor when the power supply voltage is high, and a switched position at a side of the p-channel MOS field effect transistor when the power supply voltage is low, whereby dedicated input/output terminals for the voltage step-up circuit may well be unnecessary, resulting in an improved adativeness to a semiconductor LSI.

Moreover, to achieve the object described, another genus of the present invention provides a voltage step-up circuit comprising an input terminal, a power supply terminal for providing a power supply voltage, an output terminal, first and second MOS field effect transistors of an n-channel type diode-connected, respectively, and serially connected between the power supply terminal and the output terminal, for a current conduction in a forward direction from the power supply terminal to the output terminal, a capacitor having a pair of electrode members of which one electrode member is connected to a serial interconnection between the first and second MOS field effect transistors, a third MOS field effect transistor of an n-channel enhancement type connected between the input terminal and the other electrode member of the capacitor to constitute a current path therebetween, a fourth MOS field effect transistor of a p-channel enhancement type connected in parallel to the third MOS field effect transistor, a limiter means including a fifth MOS field effect transistor, the limiter means being responsive to the power supply voltage to output an identical voltage to the power supply voltage, as the power supply voltage has a value not exceeding a critical value depending on a threshold voltage of the fifth MOS field effect transistor, and a constant voltage limited to the critical value, as the power supply voltage has a value exceeding the critical value, the limiter means being connected at an output point thereof to a gate electrode of the third MOS field effect transistor, and a detector means including a sixth MOS field effect transistor, the detector means being responsive to the power supply voltage to output a binary control signal having a low level of a 0 volt, as the power supply voltage has a lower value than a critical value depending on a threshold voltage of the sixth MOS field effect transistor, and a high level of an identical voltage to the powre supply voltage, as the power supply voltage has a higher value than the critical value, the detector means being connected at an output point thereof to a gate electrode of the fourth MOS field effect transistor.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

There will be detailed below the preferred embodiments of the present invention, with reference to the drawings. Like members are designated by like reference characters.

Figure 2:
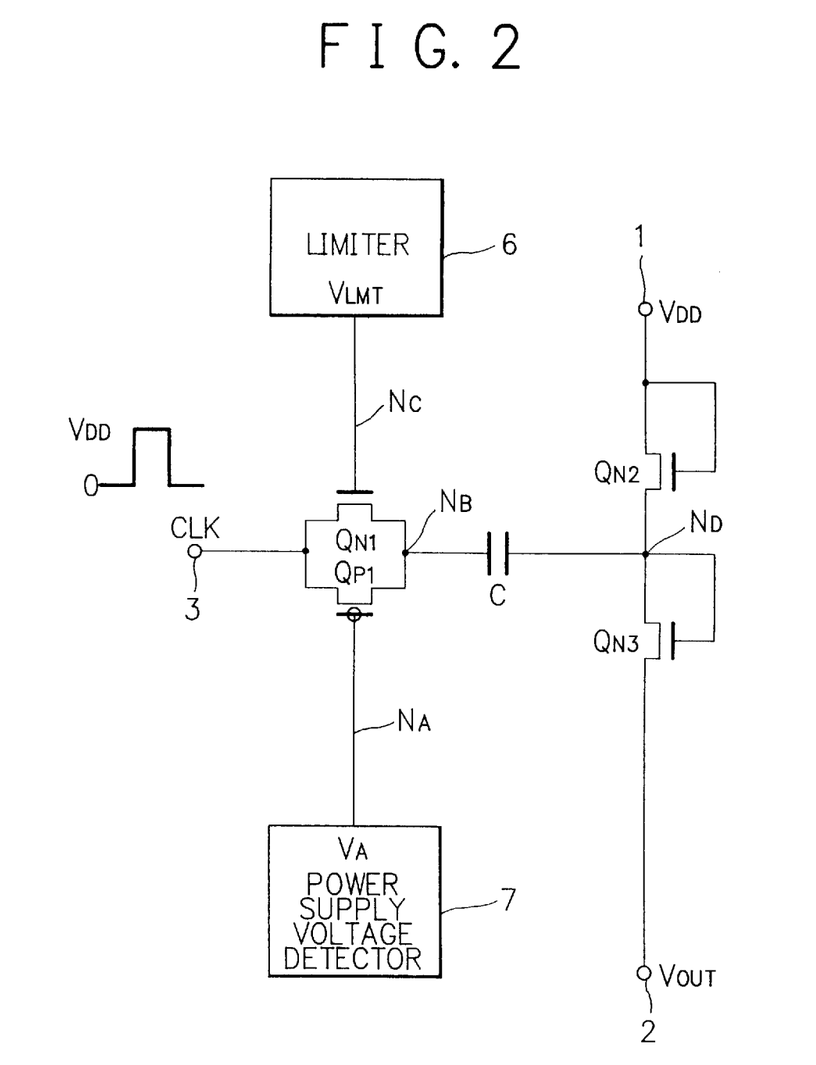
FIG. 2 is a circuit diagram of a voltage step-up circuit according to an embodiment of the invention.

FIG. 2 is a circuit diagram of a voltage step-up circuit according to an embodiment of the invention.

The voltage step-up circuit of FIG. 2 is analogous to the conventional ciruict of FIG. 1A in that a pair of diode-connected nMOS transistors $Q_{N2}$ and $Q_{N3}$ are serially connected between a power supply terminal 1 of a voltage $V_{DD}$ and an output terminal 2 of a voltage Vout, and cooperate with a capacitor C, of which one electrode is connected to a serial interconnection therebetween, to perform voltage step-up actions; and is distinctive therefrom in that an input terminal 3 of a clock signal CLK with an amplitude equivalent to the voltage $V_{DD}$ is connected to the other electrode of the capacitor C via a parallel connection circuit of an enhancement type nMOS transistor $Q_{N1}$ of which a gate voltage $V_{LMT}$ is supplied from a voltage limiter 6 and an enhancement type pMOS transistor $Q_{P1}$ of which a gate voltage $V_A$ is supplied from a power supply voltage detector 7.

Figure 3A:
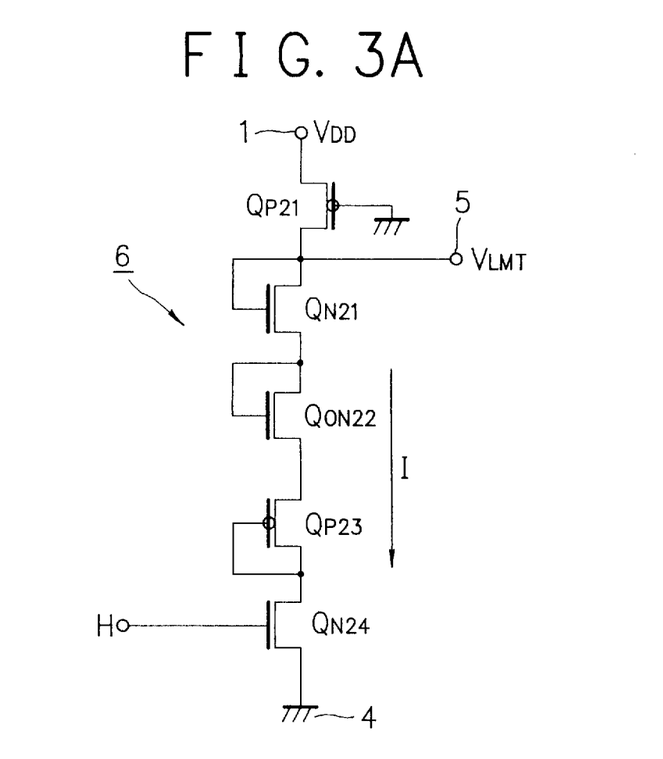
FIG. 3A is a circuit diagram of an exemplary voltage limiter of the voltage step-up circuit of FIG. 2.

FIG. 3A exemplarily shows a circuit diagram of the voltage limiter 6.

The limiter 6 of FIG. 3A has a pMOS transistor $Q_{P21}$, an nMOS transistor $Q_{N21}$, an nMOS transistor $Q_{ON22}$, a pMOS transistor $Q_{P23}$ and an nMOS transistor $Q_{N24}$ serially connected in this order between the power supply terminal 1 and a ground terminal 4.

The pMOS transistor $Q_{P21}$ is supplied with a gate voltage equivalent to a ground potential of 0V, and the nMOS transistor $Q_{N24}$, with a gate voltage of a high level H. The nMOS transistors $Q_{N21}$, and $Q_{ON22}$, as well as the pMOS transistor $Q_{P23}$, have their gate electrodes connected to their drain electrodes so that they are diode-connected.

The pMOS transistor $Q_{P21}$ is an enhancement type with a relatively low current drive ability with a relatively small conductance gm. The nMOS transistors $Q_{N21}$, and $Q_{N24}$ are each respectively an enhancement type with a relatively large conductance. The nMOS transistor $Q_{ON22}$ is of a non-doped structure in which no channel is doped with a dopant for threshold voltage control, and has a threshold voltage of approx. 0.1V and a relatively large conductance. The pMOS transistor $Q_{P23}$ is an enhancement type with a relatively large conductance. The enhancement type nMOS transistors $Q_{N\,21}$ and $Q_{N24}$ each have a threshold voltage of 0.7 V, and the enhancement type pMOS transistors $Q_{P21}$, and $Q_{P23}$ a threshold voltage of −0.8V.

There will be described below actions of the voltage limiter 6.

(1) When the power supply voltage $V_{DD}$ is smaller than a sum of the threshold voltages of the nMOS transistors $Q_{N21}$ and $Q_{N22}$ and the pMOS transistor $Q_{P23}$ that is a sum of those of the enhancement type nMOS transistor $Q_{N21}$ the nMOS transistor $Q_{ON22}$ of the non-doped structure and the enhancement type pMOS transistor $Q_{P23}$ then the pMOS transistor $Q_{P21}$ and the nMOS transistor $Q_{N24}$ are turned on, while the nMOS transistors $Q_{N21}$ and $Q_{ON22}$ and the pMOS transistor $Q_{P23}$ are turned off.

Therefore, no current is conducted from the power supply terminal I to the ground terminal 4. Accordingly, an output terminal 5 outputs the power supply voltage $V_{DD}$ as the voltage $V_{LMT}$ so that $V_{LMT}=V_{DD}$.

(2) When the power supply voltage $V_{DD}$ is larger than a sum of the threshold voltages of the enhancement type nMOS transistor $Q_{N21}$ the nMOS transistor $Q_{ON22}$ of the non-doped structure and the enhancement type pMOS transistor $Q_{P2\,3}$, then the pMOS transistor $Q_{P21}$, the nMOS transistor $Q_{N24}$, the nMOS transistors $Q_{N21}$, and $Q_{ON22}$ and the pMOS transistor $Q_{P23}$ are all turned on.

Therefore, a corresponding current I is conducted from the power supply terminal 1 to the ground terminal 4. As the pMOS transistor $Q_{P21}$ has a smaller conductance than the other MOS transistors $Q_{N21}$, $Q_{ON22}$, $Q_{P23}$ and $Q_{N24}$ the output terminal 5 outputs a limited voltage $V_{C1}$. as the voltage $V_{LMT}$, such that $V_{LMT}=V_{C1}=$a voltage limited by the threshold voltage of the enhancement type nMOS transistor $Q_{N21}$ plus the threshold voltage of the nMOS transistor $Q_{ON2}$ 2 of the non-doped structure plus the threshold voltage of the enhancement type pMOS transistor $Q_{P23}$.

Figure 3B:
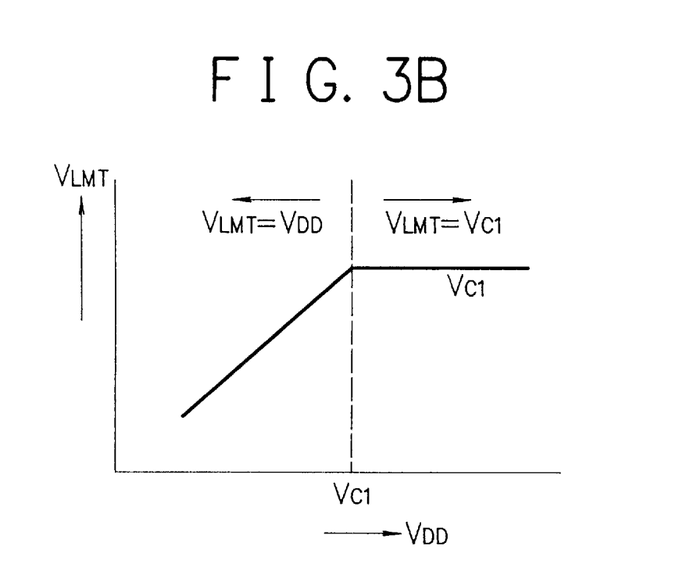
FIG. 3B is an input-output characteristic curve of the voltage limiter of FIG. 3A.

FIG. 3B shows an input-output characteristic curve of the voltage limiter 6 of FIG. 3A.

As shown in FIG. 3B, the output voltage $V_{LMT}$ of the limiter 6 is variable so that $V_{LMT}=V_{DD}$, as the power supply voltage $V_{DD}$ varies between from the threshold voltage of the pMOS transistor $Q_{P21}$ to a critical voltage ($=V_{C1}$) equivalent to the sum of the threshold voltages of the MOS transistors $Q_{N21}$, $Q_{ON22}$ and $Q_{P23}$; but is kept at the limited voltage $V_{C1}$, as the power supply voltage $V_{DD}$ exceeds the critical voltage ($=V_{C1}$).

As a result, the input-output characteristic curve is represented by a line segment of a 45° slope of which an extension passes an origin, when $V_{DD} \leq V_{C1}$, and by a line segment of $V_{LMT}=V_{C1}$(=constant), when $V_{C1} \leq V_{DD}$.

Figure 4A:
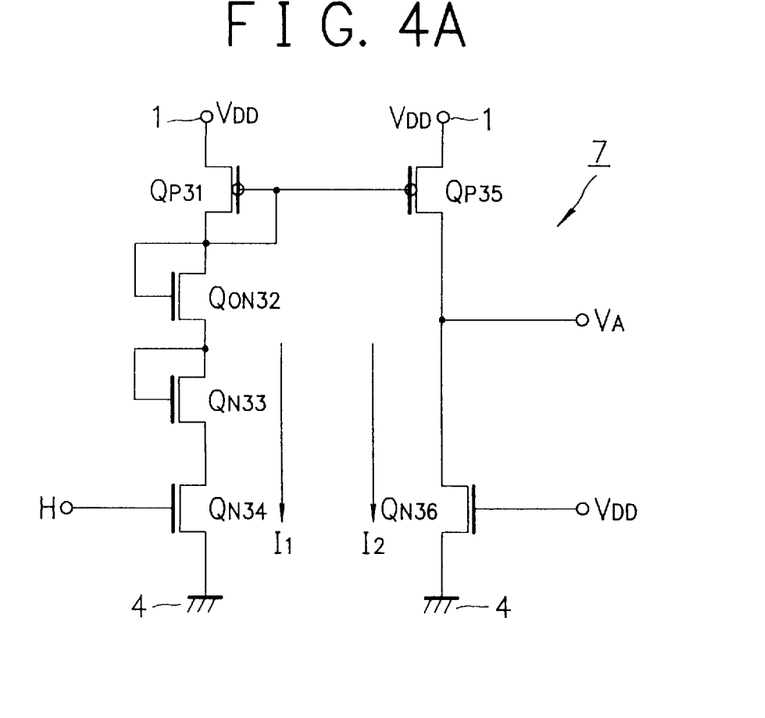
FIG. 4A is a circuit diagram of an exemplary power supply voltage detector of the voltage step-up circuit of FIG. 2.

FIG. 4A exemplarily shows a circuit diagram of the power supply voltage detector 7.

The voltage detector 7 of FIG. 4A comprises a current mirror circuit composed of a pair of pMOS transistors $Q_{P31}$ and $Q_{P35}$.

At an input side of the current mirror circuit, the pMOS transistor $Q_{P31}$ has a source electrode thereof connected to the power supply terminal 1 of the voltage $V_{DD}$, and a common connection of drain and gate electrodes thereof connected to the ground terminal 4 via a serial connection of an nMOS transistor $Q_{ON32}$ of which a gate electrode and a drain electrode are common-connected to each other for a diode connection, another nMOS transistor $Q_{N33}$ of which a gate electrode and a drain electrode also are common-connected to each other for a diode connection and still another nMOS transistor $Q_{N34}$ supplied with a gate voltage of a high level H.

At an output side of the current mirror circuit, the pMOS transistor $Q_{P35}$ has a source electrode thereof connected to the power supply terminal 1 of the voltage $V_{DD}$, a gate electrode thereof connected to the gate electrode of the input-side pMOS transistor $Q_{P31}$, and a drain electrode thereof connected to the ground terminal 4 via an nMOS transistor $Q_{N\,36}$ supplied with a gate voltage equivalent to the power supply voltage $V_{DD}$.

The pMOS transistors $Q_{P31}$ and $Q_{P35}$ are each respectively an enhancement type, and the nMOS transistors $Q_{N33}$ $Q_{N34}$ and $Q_{N36}$ also, each respectively an enhancement type. The nMOS transistor $Q_{ON32}$ is of a non-doped structure.

The MOS transistors $Q_{P31}$ and $Q_{N36}$ have their conductances $gm_i$ (i=31, 36) smaller than conductances $gm_i$ (i=32, 33, 34, 35) of the other MOS transistors $Q_{ON32}$, $Q_{N3\,3}$, $Q_{N34}$ and $Q_{P35}$.

The pMOS transistors $Q_{P31}$ and $Q_{P35}$ of the current mirror circuit output an input-side current $I_1$, and an output-side current $I_2$, respectively, with a relationship such that:

$$I_2=I_1\times(gm_{35}/gm_{31}).$$

There will be described below actions of the voltage detector 7.

(1) When the power supply voltage $V_{DD}$ is smaller than a sum of threshold voltages of the nMOS transistors $Q_{ON32}$ and $Q_{N33}$ and the pMOS transistor $Q_{P31}$, that is a sum of those of the nMOS transistor $Q_{ON32}$ of the non-doped structure, the enhancement type nMOS transistor $Q_{N33}$ and the enhancement type pMOS transistor $Q_{P31}$, then the nMOS transistors $Q_{N34}$ and $Q_{N36}$ are turned on, while the pMOS transistor $Q_{P31}$ and the nMOS transistors $Q_{ON32}$ and $Q_{N33}$ are turned off.

Therefore, the current $I_1$, to be conducted from the power supply terminal 1 to the ground terminal 4 at the input side becomes a 0. As the output side pMOS transistor $Q_{P35}$ also is turned off, $I_2=I_1(gm_{35}/gm_{31})=0$. Irrespective of the current $I_2=0$, the nMOS transistor $Q_{N36}$ is turned on, so that an output voltage $V_A$ is 0V.

($_2$) When the power supply voltage $V_{DD}$ is larger than a sum of the threshold voltages of the nMOS transistor $Q_{ON32}$ of the non-doped structure, the enhancement type nMOS transistor $Q_{N33}$ and the enhancement type pMOS transistor $Q_{p\,31}$, then the nMOS transistors $Q_{N34}$ and $Q_{N36}$, the pMOS transistor $Q_{P31}$ and the nMOS transistors $Q_{ON32}$ and $Q_{N33}$ are all turned on.

Therefore, a corresponding current $I_1$ is conducted from the power supply terminal 1 to the ground terminal 4 at the input side. At the output side, the pMOS transistor $Q_{P3\,5}$ also is turned on, permitting a current $I_2=I_1(gm_{35}/gm_{31})$ to be conducted through the transistors $Q_{P35}$ and $Q_{N36}$.

The conductance $gm_{35}$ of the pMOS transistor $Q_{P35}$ is larger than the conductance $gm_{31}$ of the pMOS transistor $Q_{P31}$, e.g. by a 40-fold or near, so that it is larger than the conductance $gm_{36}$ of the nMOS transistor $Q_{N36}$.

As a result, there is output a high-level voltage $V_A$ substantially equivalent to the power supply volage $V_{DD}$, i.e. $V_A \approx V_{DD}$.

Figure 4B:
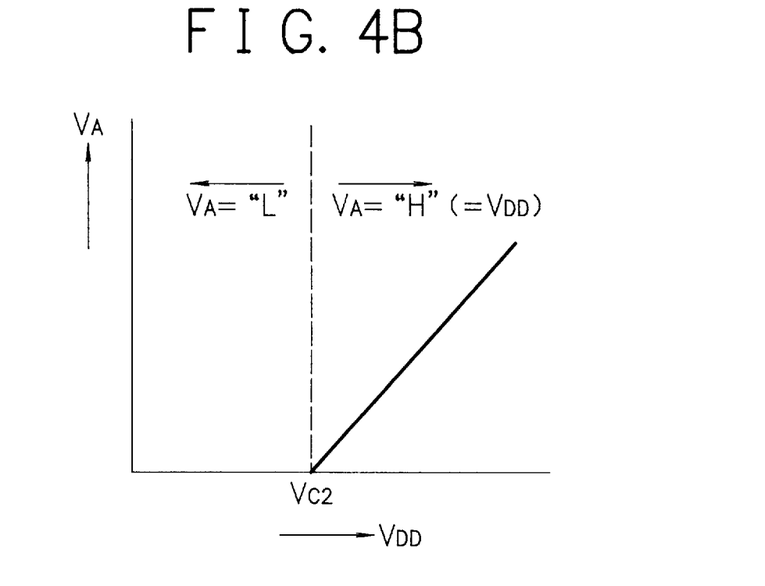
FIG. 4B is an input-output characteristic curve of the voltage detector of FIG. 4A.

FIG. 4B shows an input-output characteristic curve of the voltage detector 7 of FIG. 4A.

As shown in FIG. 4B, the output voltage $V_A$ of the detector 7 is kept at a 0V level, as the power supply voltage $V_{DD}$ is lower than a critical voltage ($=V_{c2}$) equivalent to the sum of the threshold voltages of the MOS transistors $Q_{ON3\,2}$, $Q_{N33}$ and $Q_{P31}$; but is variable so that $V_A=V_{DD}$, as the power supply voltage $V_{DD}$ is larger the critical voltage ($=V_{c2}$).

As a result, the input-output characteristic curve is represented by a line segment of a 45° slope passing a point ($V_{C2}$, 0), when $V_{C2} \leq V_{DD}$.

If a respective type (n-channel enhancement, p-channel enhancement, n-channel non-doped) of MOS transistors of the voltage limiter 6 has an identical threshold voltage to a corresponding type of MOS transistors of the voltage detector 7, the critical voltage $V_{c1}$ of the limiter 6 coincides with the critical voltage $V_{c2}$ of the detector 7.

There will be described below actions of the voltage step-up circuit of FIG. 2, as it has the volage limiter 6 of FIG. 3A and the power supply voltage detector 7 of FIG. 4A. It is assumed for a facilitated comprehension that the critical voltage $V_{c1}$ of the limiter 6 equals the critical voltage $V_{c2}$ of the detector 7, so that $V_{c1}=V_{c2}=Vc$.

The description will be made first of actions when $V_{DD} \leq Vc$, and then of actions when $Vc \leq V_{DD}$.

Figure 5:
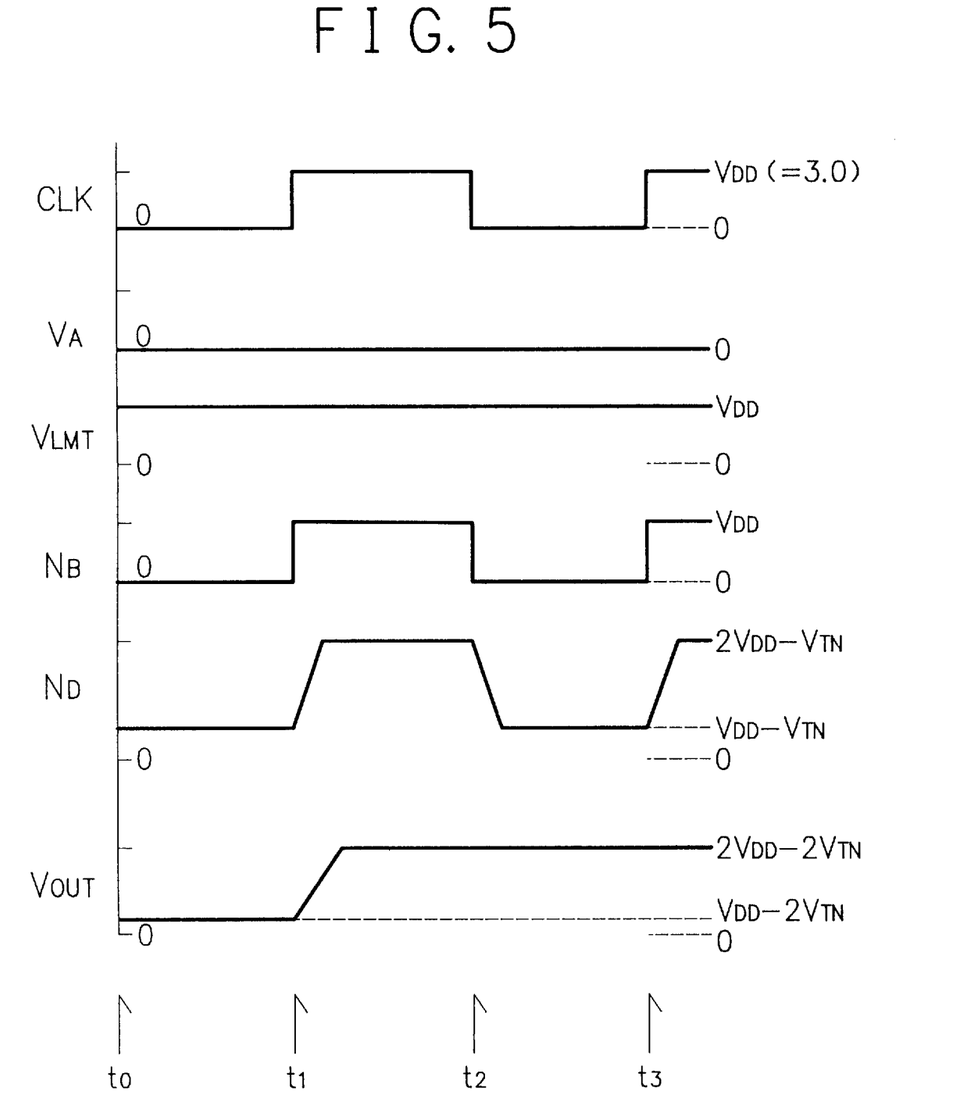
FIG. 5 is a time chart showing voltage step-up actions of the circuit of FIG. 2, when a power supply voltage is low.

FIG. 5 is a time chart showing voltage step-up actions of the circuit of FIG. 2, when the power supply voltage $V_{DD}$ is low ($V_{DD} \leq Vc$).

In the time chart of FIG. 5, the clock signal CLK supplied to the input terminal 3 of the voltage step-up circuit has a 0V level between from a time point $t_0$ to a time point $t_1$, a $V_{DD}$ level between from the time point $t_1$ to a time point $t_2$, and the 0V level between from the time point $t_2$ to a time point $t_3$.

The power supply voltage $V_{DD}$ is set to 3.0V, and the critical voltage Vc, to 3.0V. As $V_{DD}=Vc$ (i.e. $V_{DD} \leq V_{c1}$) in FIG. 3B and ($V_{DD} \leq V_{c2}$) in FIG. 4B, the limiter 6 has an output voltage $V_{LMT}=V_{DD}=3.0V$ and the detector 7 outputs a low level $V_A=0V$.

(1) In the time interval $t_0$ to $t_1$:

The nMOS transistor $Q_{N1}$ has at a gate electrode thereof an equivalent voltage to the output voltage $V_{LMT}$ (=3.0V) of the limiter 6. As the input terminal 3 is supplied with the clock signal CLK (=0V), there is developed a voltage difference equivalent to $V_{LMT}$(≧threshold voltage) between the gate electrode of the transistor $Q_{N1}$ and the input terminal 3. Therefore, the nMOS transistor $Q_{N1}$ is put in an on-state, where a node $N_B$ is forced to a voltage of 0V.

The pMOS transistor $Q_{P1}$ has at a gate electrode thereof an equivalent voltage to the output level $V_A$ (=0V) of the detector 7, and the input terminal 3 has a 0V voltage.

Therefore, the transistor $Q_{P1}$ is put in an off-state, and the node $N_B$ is set to the voltage of 0V.

On the other hand, the diode-connected nMOS transistor $Q_{N2}$ is conductive, so that a node $N_D$ has a voltage equivalent to the power supply voltage $V_{DD}$ at the terminal 1 minus a threshold voltage $V_{TN}$ of the transistor $Q_{N2}$.

Accordingly, the capacitor C has stored therein a quantity Q of charges such that:

$$\begin{aligned} Q &= \text{(voltage at node } N_D - \text{voltage at node } N_B) \times \\ &\quad \text{(capacitance of capacitor } C) \\ &= \{(V_{DD} - V_{TN}) - 0\} \times C. \end{aligned}$$

The diode-connected nMOS transistor $Q_{N3}$ has a voltage drop developed thereacross so that an output voltage $V_{OUT}$ at the terminal 2 is equivalent to the voltage at the node $N_D$ minus a threshold voltage $V_{TN}$ of the transistor $Q_{N3}$, i.e. $V_{OUT}=(V_{DD}-V_{TN})-V_{TN}=V_{DD}-2V_{TN}$.

(2) In the time interval $t_1$ to $t_2$:

The clock signal CLK is changed from the 0V level to the $V_{DD}$ level, which is supplied from the input terminal 3 to the pMOS transistor $Q_{P1}$. However, the output level $V_A$ of the detector 7 is left unchanged, holding the gate voltage of the transistor $Q_{P1}$ at the low level of 0V. With a voltage difference $V_{DD}-0$ (=$V_{DD}$≧threshold voltage) applied between the input terminal 3 and the gate electrode, the pMOS transistor $Q_{P1}$ is turned on, causing the node $N_B$ to have a voltage raised to the voltage of the input terminal 3, i.e. to the high level $V_{DD}$ of the clock signal CLK.

At the nMOS transistor $Q_{N1}$, the gate voltage is kept equivalent to the output voltage $V_{LMT}$ (=$V_{DD}$=3.0V) of the limiter 6, while both input terminal 3 and node $N_B$ have the voltage $V_{DD}$. Therefore, the transistor $Q_{N1}$ is turned off.

In other words, with the clock signal CLK turned to the high level, the pMOS transistor $Q_{P1}$ is put in an on-state, where a signal transmission route between the input terminal 3 and the node $N_B$ is changed from the side of the nMOS transistor $Q_{N1}$ to the side of the pMOS transistor $Q_{P1}$ so that the clock signal CLK at the high level is supplied to the node $N_B$ without a voltage drop.

In this action, the capacitor C has a tendency to hold the quantity Q of charges stored therein, such that:

$$\begin{aligned} Q &= \text{(voltage at node } N_D - \text{voltage at node } N_B) \times \\ &\quad \text{(capacitance of capacitor } C) \\ &= [\{V_{DD} + (V_{DD} - V_{TN})\} - V_{DD}] \times C. \end{aligned}$$

Therefore, the node $N_D$ has a voltage equivalent to $V_{DD}+(V_{DD}-V_{TN})=2V_{DD}-V_{TN}$.

On the other hand, at the nMOS transistor $Q_{N2}$, its source terminal (i.e. node $N_D$) has a higher voltage than its gate terminal (i.e. power supply terminal 1). The transistor $Q_{N2}$ is thus tunred off.

Accordingly, the output terminal 2 has a voltage $V_{OUT}$ equivalent to the voltage at the node$N_D$ minus the threshold voltage $V_{TN}$ of the transistor $Q_{N3}$. i.e. $V_{OUT}=(2V_{DD}-V_{TN})-V_{TN}=2V_{DD}-2V_{TN}$.

(3) In the time interval $t_2$ to $t_3$:

The clock signal CLK is changed from the $V_{DD}$ level again to the 0V level, which is supplied from the input terminal 3 to the nMOS transistor $Q_{N1}$. However, the output voltage $V_{LMT}$ of the limiter 6 is left unchanged, holding the gate voltage of the transistor $Q_{N1}$ at the $V_{DD}$ level of 3.0V. With a voltage difference $V_{DD}-0$ (=$V_{DD}$≧threshold voltage) applied between the gate electrode and the input terminal 3, the nMOS transistor $Q_{N1}$ is turned on, causing the node $N_B$ to have a voltage dropped to 0V.

At the pMOS transistor $Q_{P1}$, the gate voltage is kept equivalent to the output level $V_A$ (=3.0V) of the detector 7, and the input terminal 3 has the low level voltage (=0V). Therefore, the transistor $Q_{P1}$ is turned off.

In such the action, the capacitor C tends to hold the quantity Q of charges stored therein, such that:

$$\begin{aligned} Q &= \text{(voltage at node } N_D - \text{voltage at node } N_B) \times \\ &\quad \text{(capacitance of capacitor } C) \\ &= \{(V_{DD} - V_{TN}) - 0\} \times C. \end{aligned}$$

Therefore, the node $N_D$ has a voltage equivalent to $V_{DD}-V_{TN}$.

On the other hand, at the nMOS transistor $Q_{N3}$, its source terminal (i.e. output terminal 2) has a higher voltage than its gate terminal (i.e. node $N_D$). The transistor $Q_{N3}$ is thus tunred off.

Accordingly, the output terminal 2 holds the voltage obtained in the time interval $t_1$ to $t_2$, i.e. $V_{OUT}=2V_{DD}-2V_{TN}$.

Therefore, the voltage step-up circuit of FIG. 2 keeps outputting a higher voltage than the power supply voltage $V_{DD}$, with an identical step-up ratio to the conventional voltage step-up circuit.

In the foregoing description of the circuit actions for a low power supply voltage, the supplied signal to the input side ($N_B$ side) electrode of the capacitor C has a full swing between 0V level and $V_{DD}$ level so that the embodied circuit is identical in current consumption to the conventional circuit.

The voltage step-up circuit of FIG. 2 is thus identical in both step-up ratio and current consumption to the conventional circuit, when the power supply voltage $V_{DD}$ is at a low voltage side.

Figure 6:
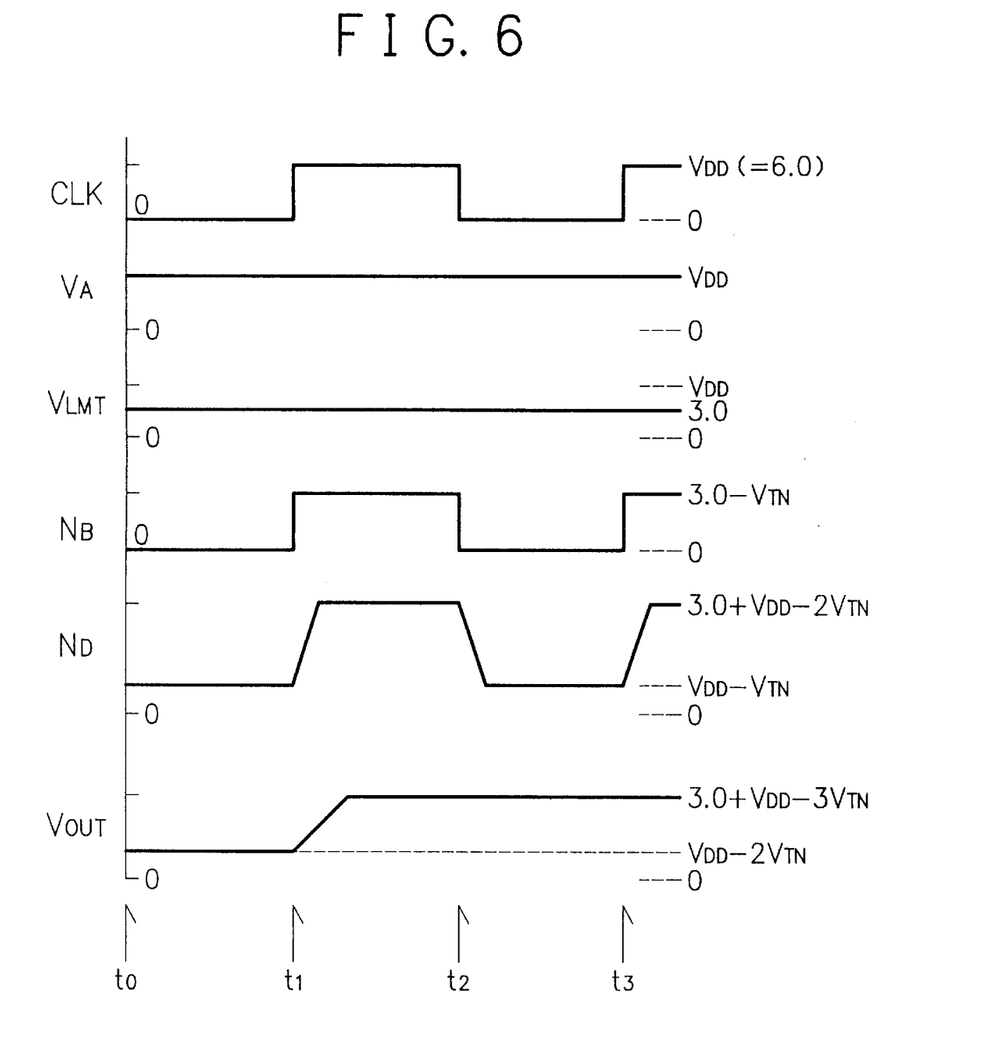
FIG. 6 is a time chart showing voltage step-up actions of the circuit of FIG. 2, when the power supply voltage is high.

FIG. 6 is a time chart showing voltage step-up actions of the circuit of FIG. 2, when the power supply voltage $V_{DD}$ is high ($V_{DD}$>Vc).

In the time chart of FIG. 6, the clock signal CLK supplied to the input terminal 3 of the voltage step-up circuit has a 0V level between from a time point $t_0$ to a time point $t_1$, a $V_{DD}$ level between from the time point $t_1$ to a time point $t_2$, and the 0V level between from the time point $t_2$ to a time point $t_3$.

The power supply voltage $V_{DD}$ is set to 6.0V, and the critical voltage Vc, to 3.0V. As $V_{DD}$ (=6.0V)>Vc (=$_{3.0}$V) (i.e. $V_{DD}$>$V_{c1}$) in FIG. 3B and ($V_{DD}$>$V_{c2}$) in FIG. 4B. the limiter 6 has a limited output voltage $V_{LMT}$=Vc (=3.0V) and the detector 7 outputs a high level $V_A$=$V_{DD}$ (=6.0V).

(1) In the time interval $t_0$ to $t_1$:

The nMOS transistor $Q_{N1}$ has at the gate electrode an equivalent voltage to the output voltage $V_{LMT}$ (=3.0V) of the limiter 6. As the input terminal 3 is supplied with the clock signal CLK (=0V), there is developed a voltage difference equivalent to $V_{LMT}$ (=Vc≧threshold voltage) between the gate electrode of the transistor $Q_{N1}$ and the input terminal 3. Therefore, the nMOS transistor $Q_{N1}$ is put in an on-state, where the node $N_B$ is forced to a 0V voltage.

The pMOS transistor $Q_{P1}$ has at the gate electrode an equivalent voltage to the high output level $V_A$ (=$V_{DD}$=6.0V)

of the detector 7, and the input terminal 3 has a 0V voltage. Therefore, the transistor $Q_{P1}$ is put in an off-state, and the node $N_B$ is set to the voltage of 0V.

On the other hand, the diode-connected nMOS transistor $Q_{N2}$ is conductive, so that the node $N_D$ has a voltage equivalent to the power supply voltage $V_{DD}$ at the terminal 1 minus the threshold voltage $V_{TN}$ of the transistor $Q_{N2}$.

Accordingly, the capacitor C has stored therein a quantity Q of charges such that:

$$Q = \text{(voltage at node } N_D - \text{voltage at node } N_B) \times$$
$$\text{(capacitance of capacitor } C)$$
$$= \{(V_{DD} - V_{TN}) - 0\} \times C.$$

The diode-connected nMOS transistor $Q_{N3}$ has a voltage drop developed thereacross so that an output voltage $V_{OUT}$ at the terminal 2 is equivalent to the voltage at the node $N_D$ minus the threshold voltage $V_{TN}$ of the transistor $Q_{N3}$, i.e. $V_{OUT}=(V_{DD}-V_{TN})-V_{TN}=V_{DD}-2V_{TN}$.

(2) In the time interval $t_1$ to $t_2$:

The clock signal CLK is changed from the 0V level to the $V_{DD}$ level (=6.0V), which is supplied from the input terminal 3 to the nMOS transistor $Q_{N1}$. The output voltage $V_{LMT}$=Vc (=3.0V) of the limiter 6 is left unchanged, holding the gate voltage of the transistor $Q_{N1}$ at the voltage $V_{LMT}$=Vc (=3.0V). With a voltage difference $V_{DD}-VC$ (=3.0V≧threshold voltage) applied between the input terminal 3 and the gate electrode, the nMOS transistor $Q_{N1}$ is turned on, causing the node $N_B$ to have a raised voltage.

However, the nMOS transistor $Q_{N1}$ of an enhancement type undergoes a threshold drop effect that a typical enhancement type nMOS transistor is subjected to when a source electrode thereof is connected to a load, with drain and gate voltages thereof fixed, so that a voltage difference corresponding to a threshold voltage of the transistor develops between gate and source electrodes thereof, thus holding the source voltage at a raised level to the gate voltage minus the threshold voltage.

Due to the threshold drop effect of the nMOS transistor $Q_{N1}$, the raised voltage at the node $N_B$ is limited to the gate voltage of the transistor $Q_{N1}$ (=output voltage $V_{LMT}$ of the limiter 6) minus the threshold voltage $V_{TN}$, i.e. to $V_{LMT}-V_{TN}=3.0-V_{TN}$.

At the pMOS transistor $Q_{P1}$, the input interminal 3 is supplied with the clock signal CLK at the high level of $V_{DD}$ (=6.0V), while the node $N_B$ has the voltage of $V_{LMT}-V_{TN}$ as described and the gate electrode is held equivalent to the output level $V_A=V_{DD}$ (=6.0V). Therefore, the transistor $Q_{P1}$ is turned off.

In other words, with the clock signal CLK changed from the 0V level to the $V_{DD}$ (=6.0V) level, the pMOS transistor $Q_{P1}$ is kept off, holding the signal transmission route from the input terminal 3 to the capacitor C still at the side of the nMOS transistor $Q_{N1}$, and the node $N_B$ has a voltage raised towards the voltage of $V_{DD}$ as a higher level of the clock signal CLK and limited to the voltage of $V_{LMT}-V_{TN}$ by the threshold drop effect of the nMOS transistor $Q_{N1}$.

The above circuit action is different from the action in the case of the low power supply voltage in two significant points, i.e. in that the signal transmission route is left at the nMOS transistor $Q_{N1}$ side and that the input signal to the capacitor C has a limited amplitude due to the threshold drop effect of the transistor $Q_{N1}$.

In the above action also, the capacitor C has a tendency to hold the quantity Q of charges stored therein, such that:

$$Q = \text{(voltage at node } N_D - \text{voltage at node } N_B) \times$$
$$\text{(capacitance of capacitor } C)$$
$$= [\{(V_{LMT} - V_{TN}) + (V_{DD} - V_{TN})\} - (V_{LMT} - V_{TN})] \times C.$$

Therefore, the node $N_D$ has a voltage equivalent to $(V_{LMT}-V_{TN})+(V_{DD}-V_{TN})=(V_{LMT}+V_{DD})-2V_{TN}=3.0+V_{DD}-2V_{TN}$.

On the other hand, at the nMOS transistor $Q_{N2}$ the source terminal (i.e. node $N_D$) has a higher voltage than the gate terminal (i.e. power supply terminal 1). The transistor $Q_{N2}$ is thus tunred off.

Accordingly, the output terminal 2 has a voltage $V_{OUT}$ equivalent to the voltage at the node$N_D$ minus the threshold voltage $V_{TN}$ of the transistor $Q_{N3}$, i.e. $V_{OUT}=(V_{LMT}+V_{DD}-2V_{TN})-V_{TN}=(V_{LMT}+V_{DD})-3V_{TN}=3.0+V_{DD}-3V_{TN}$.

(3) In the time interval $t_2$ to $t_3$:

The clock signal CLK is changed from the $V_{DD}$ level again to the 0V level, which is supplied from the input terminal 3 to the nMOS transistor $Q_{N1}$. However, the output voltage $V_{LMT}$ of the limiter 6 is left unchanged, holding the gate voltage of the transistor $Q_{N1}$ at the level of $V_{LMT}$=Vc (=3.0V). With a voltage difference $V_{LMT}-0$ (=Vc>threshold voltage) applied between the gate electrode and the input terminal 3, the nMOS transistor $Q_{N1}$ is turned on, causing the node $N_B$ to have a voltage dropped to 0V.

At the pMOS transistor $Q_{P1}$, the gate voltage is kept equivalent to the output level $V_A$ (=6.0V) of the detector 7, and the input terminal 3 has the low level voltage (=0V). Therefore, the transistor $Q_{P1}$ is turned off, so that the node $N_B$ is set to 0V.

In such the action, the capacitor C tends to hold the quantity Q of charges stored therein, such that:

$$Q = \text{(voltage at node } N_D - \text{voltage at node } N_B) \times$$
$$\text{(capacitance of capacitor } C)$$
$$= \{(V_{DD} - V_{TN}) - 0\} \times C.$$

Therefore, the node $N_D$ has a voltage equivalent to $V_{DD}-V_{TN}$.

On the other hand, at the nMOS transistor $Q_{N3}$, the source terminal (i.e. output terminal 2) has a higher voltage than the gate terminal (i.e. node $N_D$). The transistor $Q_{N3}$ is thus tunred off.

Accordingly, the output terminal 2 holds the voltage obtained in the time interval $t_1$ to $t_2$, i.e. $V_{OUT}=(V_{LMT}+V_{DD})-3V_{TN}=3.0+V_{DD}-3V_{TN}$.

Therefore, the voltage step-up circuit of FIG. 2 keeps outputting a higher voltage than the power supply voltage $V_{DD}$.

In the foregoing description of the circuit actions for a high power supply voltage, the supplied signal to the input side ($N_B$ side) electrode of the capacitor C swings between 0V level and a level $v=V_{LMT}-V_{TN}=3.0-V_{TN}$. The capacitor C has a charge-discharge current i=f~v~C, as described.

Assuming an identical frequency for the clock signal CLK and an identical an identical capacitance C for the capacitor C, and letting $i_A$ be the charge-discharge current of the capacitor C in the voltage step-up circuit of FIG. 2 and $i_B$ be that in the conventional circuit, it so follows that:

$i_A/i_B$ = (signal amplitude at node $N_B$) ÷

(CLK amplitude at input terminal 3)

= $(V_{LMT} - V_{TN})/V_{DD}$

= $(3.0 - V_{TN})/V_{DD}$.

As the amplitude of clock signal CLK is 6.0V and the critical voltage Vc (=the limit level $V_{c1}$ of the limitter 6) is 3.0V, assuming 0.1V as the threshold voltage $V_{TN}$ of the nMOS transistor $Q_{N1}$, it so follows that:

$i_A/i_B = (3.0-0.1)/6.0 = 0.48$, which means a reduction of approx. 50% from a conventional capacitor charge-discharge current, permitting a substantially halved current consumption in a voltage step-up circuit.

In the present embodiment, the voltage limiter 6 and the power supply voltage detector 7 are incorporated in the voltage step-up circuit. However, such an arrangment is not always necessary.

The described effects may be achieved by a voltage step-up circuit in which a parallel connection of an nMOS transistor $Q_{N1}$ of an enhancement type having a threshold drop effect and a pMOS transistor $Q_{P1}$ is inserted in a signal transmission path between from an input terminal 3 to a capacitor C, to have a combination of a level conversion due to the threshold drop effect of the nMOS transistor $Q_{N1}$ and a switching action of the pMOS transistor $Q_{P1}$ adapted so that, when a power supply voltage $V_{DD}$ is high, an input clock signal CLK is let to pass the nMOS transistor $Q_{N1}$, where it is stepped down at a high-level side threof, to be transmitted to the capacitor C and, when the power supply voltage $V_{DD}$ is low, the clock signal CLK is let to pass the pMOS transistor $Q_{P1}$ to be transmitted to the capacitor C, in a switchable manner.

Therefore, external signals representative of an output $V_{LMT}$ of a limitter 6 and an output $V_A$ of a detector 7, respectively may be input to directly control conduction status of the nMOS transistor $Q_{N1}$ and the pMOS transistor $Q_{P1}$.

However, such external control signals may need dedicated terminals therefor.

Moreover, in the embodiment described, the critical voltage $V_{C1}$ of the voltage limiter 6 and the critical voltage $V_{C2}$ of the power supply voltage detector 7 are set to be identical to each other.

However, such critical voltages depend on threshold voltages of associated transistors and may be different from each other in a pratical design, while achieving like effects.

In this respect, an increased number of kinds of threshold voltages in a single semiconductor LSI chip may result in an increased complexity. Therefor, the setting of $V_{C1}=V_{C2}$ is preferable.

While the present invention has been described with reference to the particular illustrative embodiment and partial modification thereof, it is not to be restricted by them by only by the appended claims. It is to be appreciated that those skilled in the art can change or modify the embodiments without departing from the scope and spirit of the present invention.

What is claimed is:

1. A voltage step-up circuit, comprising:
   an input terminal for receiving an externally supplied high level periodical signal;
   a power supply terminal for providing a power supply voltage;
   an output terminal;
   a pair of rectifying members serially connected between the power supply terminal and the output terminal, for current conduction in a forward direction thereof from the power supply terminal to the output terminal; and
   a capacitor having a pair of electrode members of which one electrode member is connected to a serial interconnection between the rectifying members,
   wherein the periodical signal supplied to the input terminal is input to the other electrode member of the capacitor to have a voltage at the serial interconnection periodically vary so that the output terminal develops thereon a higher voltage than the power supply voltage,
   wherein the voltage step-up circuit further comprises:
      a signal transmission path for transmitting the periodical signal to be input from the input terminal to the capacitor, and
      including a level conversion member for stepping down an amplitude of the periodical signal, at the high-level side thereof, to provide a level-converted signal to the capacitor, and a switch member connected in parallel to the level conversion member for making a bypass thereto, as the switch member is conductive; and an amplitude limiting means coupled to the signal transmission path for amplitude-limiting the periodical signal.

2. A voltage step-up circuit according to claim 1, wherein:
   the level conversion member comprises an n-channel MOS field effect transistor of an enhancement type having a threshold drop effect, and
   the switch member comprises a p-channel MOS field effect transistor of an enhancement type.

3. A voltage step-up circuit according to claim 2, further comprising:
   means for generating from the power supply voltage a constant voltage not exceeding the power supply voltage and providing the constant voltage as a gate voltage of the n-channel MOS field effect transistor so that the level-converted signal has a controlled voltage on the high-level side thereof; and
   means for making the p-channel MOS field effect transistor conductive and non-conductive in accordance with a level of the power supply voltage so that the signal transmission path, as the periodical signal has the high level, is responsive to the level of the power supply voltage to have a switched position at a side of the n-channel MOS field effect transistor when the power supply voltage is high, and a switched position at a side of the p-channel MOS field effect transistor when the power supply voltage is low.

4. A voltage step-up circuit comprising:
   an input terminal;
   a power supply terminal for providing a power supply voltage;
   an output terminal;
   first and second MOS field effect transistors of an n-channel type diode-connected, respectively, and serially connected between the power supply terminal and the output terminal, for a current conduction in a forward direction from the power supply terminal to the output terminal;
   a capacitor having a pair of electrode members of which one electrode member is connected to a serial interconnection between the first and second MOS field effect transistors;

a third MOS field effect transistor of an n-channel enhancement type connected between the input terminal and the other electrode member of the capacitor to constitute a current path therebetween;

a fourth MOS field effect transistor of a p-channel enhancement type connected in parallel to the third MOS field effect transistor;

a limiter means including a fifth MOS field effect transistor, the limiter means being responsive to the power supply voltage to output an identical voltage to the power supply voltage, as the power supply voltage has a value not exceeding a critical value depending on a threshold voltage of the fifth MOS field effect transistor, and a constant voltage limited to the critical value, as the power supply voltage has a value exceeding the critical value, the limiter means being connected at an output point thereof to a gate electrode of the third MOS field effect transistor; and a detector means including a sixth MOS field effect transistor, the detector means being responsive to the power supply voltage to output a binary control signal having a low level of a 0 volt, as the power supply voltage has a lower value than a critical value depending on a threshold voltage of the sixth MOS field effect transistor, and a high level of an identical voltage to the power supply voltage, as the power supply voltage has a higher value than the critical value, the detector means being connected at an output point thereof to a gate electrode of the fourth MOS field effect transistor.

* * * * *